United States Patent
Koulik et al.

(10) Patent No.: US 6,365,235 B2
(45) Date of Patent: *Apr. 2, 2002

(54) SURFACE TREATMENT METHOD AND DEVICE THEREFOR

(75) Inventors: Pavel Koulik; Evgenia Zorina, both of Yverdon les Bains (CH)

(73) Assignee: TePla AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/068,695
(22) PCT Filed: Nov. 12, 1996
(86) PCT No.: PCT/CH96/00400
 § 371 Date: May 13, 1998
 § 102(e) Date: May 13, 1998
(87) PCT Pub. No.: WO97/18344
 PCT Pub. Date: May 22, 1997

(30) Foreign Application Priority Data

Nov. 13, 1995 (CH) .................................................. 3207/95

(51) Int. Cl.$^7$ ............................................. C23C 16/452
(52) U.S. Cl. .................. 427/525; 427/531; 427/535; 427/536; 427/537; 216/62; 216/75
(58) Field of Search .................................. 427/525, 531, 427/535, 536, 537; 216/62, 75

(56) References Cited

U.S. PATENT DOCUMENTS 4,886,681 A * 12/1989 Clabes et al. .................. 427/38
5,474,642 A * 12/1995 Zorina et al.

* cited by examiner

Primary Examiner—Timothy Meeks
(74) Attorney, Agent, or Firm—Clifford W. Browning; Woodard, Emhardt, Naughton, Moriarty & McNett Patent and Trademark Attorneys

(57) ABSTRACT

A surface treatment method wherein one or more active particle streams are generated and aimed at a surface to be treated so that the particle stream interacts therewith. The active particle stream consists of activated particles forming chemically active sites on the surface, and modifying particles occupying said sites. The energy of the activated particles is greater than the energy at break of the inhibited surface bonds of the surface, and lower than the radiative flaw formation energy on the surface. The strength of the particle stream at the treated surface is greater than a quantity N/t where N is the surface density of the inhibited bonds to be broken and t is the duration of exposure of any point on the treated surface to the stream. A device for carrying out the method is also provided.

9 Claims, 4 Drawing Sheets

SURFACE TREATMENT METHOD AND DEVICE THEREFOR

FIELD OF THE INVENTION

The invention relates to a surface treatment method, in particular for the surfaces of hard bodies and condensed media. It,likewise relates to a device for implementing the method.

The method and device according to the invention may be used in particular in the electrical engineering sector, in electronics, the chemical industry, the foodstuffs industry, machine tools, medicine, pharmaceuticals, and in particular for operations involving cleaning, sterilisation, pickling, the deposition of films, surface alloys, etc.

BACKGROUND ART

A treatment method is known for solid surfaces by means of plasma under vacuum, in the course of which a stream of activated particles is formed at low pressure. This method is described in the document "The iono-plasmic treatment of materials", Ivanovskii G. F. and Petrov V. I., Moscow 1986. This particle stream acts on the surface of the solid body and the volatile products resulting from the interaction of the plasma are evacuated from the reaction zone. The composition of the plasma is selected on the basis of the intention behind the treatment. In order to increase the effectiveness of the operation by plasma under vacuum, the kinetic energy of the particles is increased up to 100 eV and above, which causes the appearance of flaws due to the destructive bombardments of the structure of the surface being treated. This treatment, which requires the maintaining of the vacuum, is used for preference in situations in which the surfaces to be treated are of restricted dimensions, in particular in the electronics industry.

A dynamic plasma treatment method (Dynamic Plasma Operation or DPO) is likewise known. This method is described in the documents "Dynamical Plasma Operating (DPO) of solid surfaces plasma jets", Koulik P. P., ed. Solonenko O. P., Fedorchenko A. V., Frunze VSP 1990, pp. 639–653, and "Dynamical Plasma Operating (DPO) of solid surfaces plasma jets", Koulik P. P. et al., ed. Nouka, 1987, pp. 4–13, 58–96. This consists of creating a hydrodynamic stream of activated particles, directing them towards the surface to be treated, causing them to react with this surface, and evacuating the volatile products accompanying the reaction, making use of the hydro-dynamic stream pressure; i.e. at high pressure. The surface treated by this method is subject to the action. of high-enthalpy stream, which contain active particles (pickling, cleaning, depositing of films, etc.).

The approximate values of the parameters of the plasma stream are as follows:

Temperature: $8·10^3–15·10^3$ K

Speed: 100–200 m/s

Density of heat flow on the surface, oriented perpendicular to the stream:

$10^{24}–10^{25}$ particles/m²·s

For these plasma stream parameter values the interaction of the plasma with the surface can only be momentary, and does not exceed 10 ms. The treated object passes through the plasma stream at a controlled speed (approx. 1 m/s) in such a way that, for transient heat transfer, the maximum surface temperature does not exceed a given limit. According to the technological operation concerned, this temperature level may be several tens of degrees, or even several hundreds of degrees.

Since the duration of the DPO method is less than the characteristic diffusion time in the solid body, the DPO treatment does not induce flaws in the structure of the solid body treated.

Since the temperature of the electrons on the surface of the body or medium being treated does not exceed 0.08 eV, and that of the ions, atoms, and other heavy components does not exceed 0.03 eV, it follows that radiative flaws of the structure of the surface layer treated will be excluded.

The principal physical energy of the DPO method is expressed by the two inequalities:

$$l_r<<d<<l_{in} \qquad (1)$$

where $l_r$ is the mean length of the free path of the plasma particles, d is the thickness of the limit layer at the critical point, and $l_{in}$ is the mean diffusion length of the activated particles of the plasma. The left inequality ensures the continuity of the plasma medium, and that on the right the maintaining of imbalance necessary for an effective plasmo-chemical action on the surface.

The DPO method is easy to use, in particular at atmospheric pressure. Passage at atmospheric pressure allows for the productivity of the treatment to be enhanced by 10 to 100 times by comparison with the vacuum plasma process. The quality of the treatment is greater and the technology simplified.

Nevertheless, the DPO method can only be used under the following conditions:

The treatment is applied by a high-enthalpy plasma jet;

Stationary cooling of the objects treated is excluded, and it is necessary to work under non-stationary heat exchange conditions; i.e. to submit the treated surface to a momentary plasma action.

These conditions perceptibly restrict the possibilities of this technology, and render the treatment of many materials difficult.

The objective of the invention is to broaden the choice of materials which can be treated, to make new surface treatments possible thanks to the separate monitoring of the activated and stream-modifying functions, and also to broaden the ranges of the physical parameters of the streams used for the treatment.

BRIEF SUMMARY OF THE INVENTION

To this end, the invention relates to a surface treatment method, in particular of the surfaces of hard bodies and condensed media, in the course of which a stream or streams of activated particles is or are created, and directed on to the surface to be treated, and the particle streams are caused to interact with the surface, and in which the stream(s) of activated particles is (are) composed of activated particles, forming chemically active sites on the surface, and modifying particles occupying these sites, the energy of the activated particles being greater than the energy at break of the inhibited surface bonds of the treated surface, and lower than the radiative flaw formation energy on the surface, the intensity, at the level of the surface treated, of the stream of activated particles and the stream of the modifying particles being greater than the value N/t, where N is the surface density of the inhibited bonds to be broken, and t is the presence time of any point on the treated surface, under the stream.

The invention likewise concerns a device for surface treatment for the implementation of the method, comprising a device for introducing the active product from an active particle stream generator, including an energy source, a reactor creating the stream of activated particles, a medium for transporting the activated particles generated to the treated surface, and a medium for evacuating the residue products of the treatment, and in which the active particle generator comprises:

a) Two reactors, the first creating a stream of activated particles, which, when coming in contact with the treated surface, form chemically active sites, the second creating a stream of modifying particles which have just occupied the sites;

b) Two transport devices for the activated and modifying particles respectively by means of flows carrying the activated and modifying particles onto the treated surface, the duration of transport of the activated and modifying particles from the reactor to the surface to be treated being less than their respective life time durations;

c) A device for the relative displacement of the surface treated in relation to the streams of activated and modifying particles, ensuring that the time lapse between the activation and modification actions of one common area on the treated surface is less than the life time of the activated sites created by the activated particles, and that the areas of the surface to be treated, being first in contact with the stream of activated particles and then only with the stream of modifying particles;

d) Two evacuation devices, one for the activated particles deactivated after their action on the treated surface, the other for the residual particles appearing after the action of modification of the surface, the two systems being conceived in such a way that the evacuation of the one group will not cause any obstacle to the action or evacuation of the others.

According to one embodiment, the activated particles coincide with the modifying particles, which allows the generator device to be reduced to an introduction device, a reactor, a transport device, a device for displacement relative to the surface, and an evacuation device.

According to a variant embodiment, the reactor, the transport and evacuation devices may be common for the activated particles and the modifying particles.

According to another variant embodiment, the evacuation device may be common for the activated particles and for the residual products.

A description is provided below of the method and device according to the invention, making reference to the appended drawings.

DETAILED DESCRIPTION OF THE INVENTION

Figure 1:
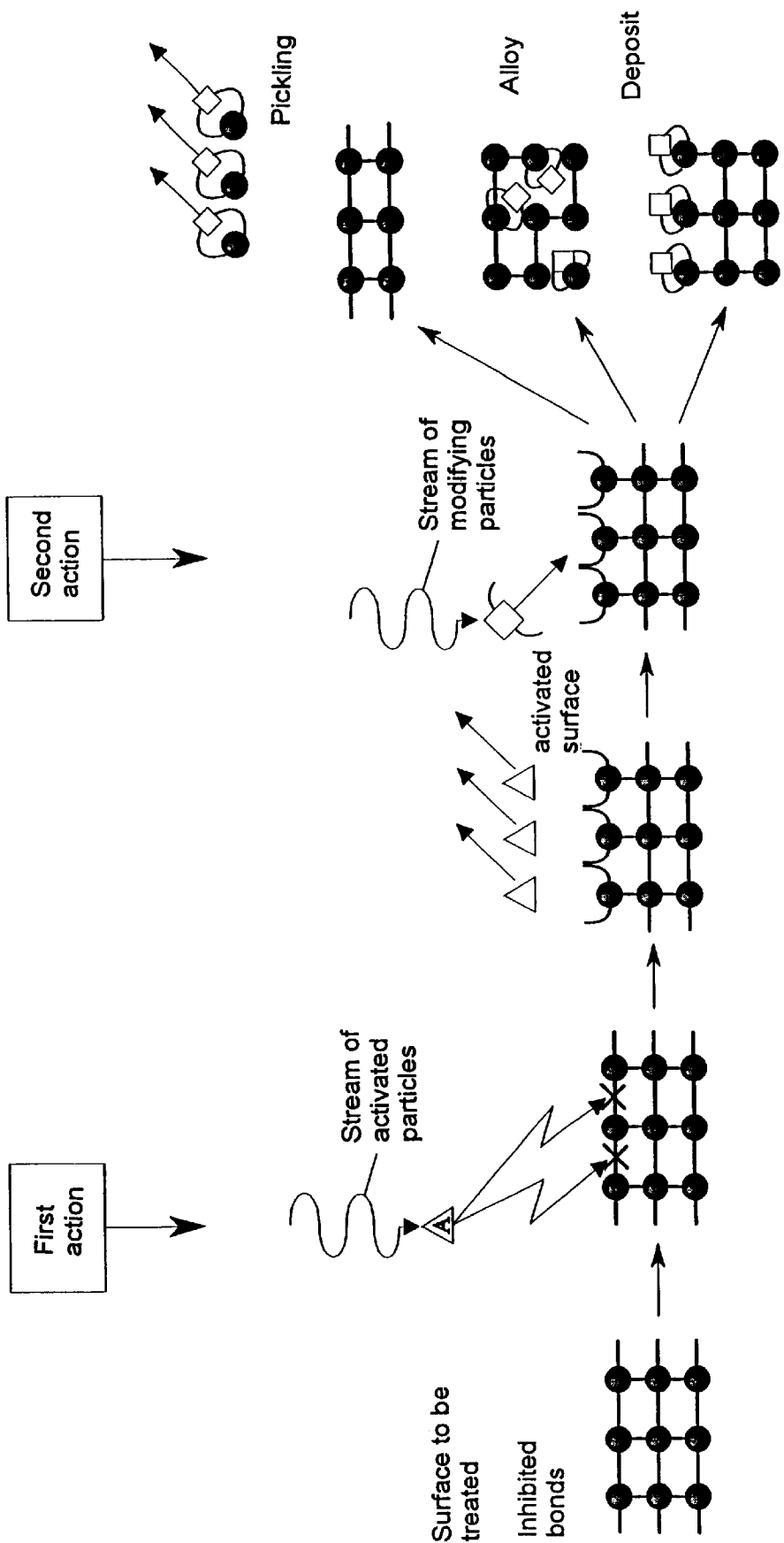
FIG. 1 is a general diagram illustrating the method.

In order to resolve the problems of the method of the prior art, the solution consists of creating one or more streams of particles, directing them towards the treated surface, and causing these particles to interact with the surface in such a way that, according to the invention:

The stream of activated particles is formed by particles which, once activated by the plasma, form chemically active sites on the surface, The stream of modifying particles interacts with the surface, in such a way as to occupy these active sites, To do this, the energy of the activated particles is greater than the energy for breaking the inhibited bonds of the treated surface, and lower than the radiative flaw formation energy, And the intensity of the stream of activated particles on the treated surface, as well as of the stream of modifying particles, is greater than the quantity N/t, where N is the surface density of the inhibited bonds of the treated surface, and t is the presence time of a point of the treated surface under the stream.

The essence of the invention rests in the fact that, by contrast with the DPO method, one or more streams are created which contain specially chosen particles, one group activated, the other modifying, the functions of which are different:

a) The role of the stream of activated particles is to transform the treated surface into an activated state, i.e. to create chemically active sites thanks to the breaking of the inhibited surface bonds; for example:
surface bonds which are created as a result of the reconstruction (dimerisation and others) of the surfaces of silicon, gallium arsenic, and other homopolar and heteropolar semi-conductors, of gold, nickel, stainless steel, and other metals and alloys which do not oxidise;
oxide bonds for aluminium and other oxidisable metals, lateral bonds of radicals in the polymers and bipolymers.

In order for activated particles to be able to play their part, their energy Ea must be greater than the energy at break of the inhibited bond. The energy Ea must, on the other hand, be lower than the radiative flaw formative energy in order to maintain the quality and structure of the surface layer of the treated body.

As the intensity of the stream of activated particles drops, the treated surface must be greater than the quantity N/t, where N is the surface density of the inhibited bonds to be broken, and t is the duration of the presence of any point of the treated surface beneath the stream. The quantity N may be lower than the total number of the inhibited bonds of the treated surface in the event that the desired treatment does not involve the breaking of all the inhibited bonds of the surface.

b) The role of the stream of modifying particles is to occupy the chemically active sites, resulting of the impact of the activated particles; i.e. to make use of the activated state of the surface created by the activated particles, in order to operate the desired treatment in an effective manner, such as, for example, the depositing of films (with optimum chemical adhesion), pickling (with the formation of volatile, chemically solid molecules), etc.

The processes of formation and bonding of the chemically active sites of the treated surface can be developed in parallel. The modifying particles can be used in an active state.

The intensity of the stream of modifying particles on the treated surface is selected to be greater than the quantity N/t, in such a way as to make use of all the activated sites created by the activated particles. In this case, the treatment is optimum.

In certain particular cases, the activated and modifying particles may coincide, being of the same chemical nature.

The physico-chemical mechanism of the surface treatment accordingly consists of the following:

In the first instance, under the action of the activated particles, the atoms of the surface acquire chemical properties which could have been obtained, for example, by suddenly removing a surface layer of macroscopic thickness of the material which is to be treated. It is this layer which, under usual conditions, presents an obstacle to the appearance of a chemical activity of the surface.

Accordingly, the effect of the action of the activated particles is to create chemically active sites on the surface (radicals).

Next, the modifying particles bond with these sites, which allows for the desired surface treatment to be carried out in an effective manner. Because the activation state of the surface has a limited life time, the process of bonding with these sites must take place within a shorter time than this life time.

This description of the physico-chemical mechanism for the surface treatment allows for provision to be made for the possibility (and even the necessity) of separate formation of the streams of activated particles and modifying particles.

This allows for a check to be conducted separately on the activating and modifying functions of the stream.

The particles can be activated by different means, not necessarily by the heating of the gas which they form up to a temperature of (10 to 15)·10³ K and the formation of a plasma, a is the case with the DPO method. In the present invention, the activation of the particles and the heating of the gas which they form are processes which are inherently distinct and independent. It is therefore possible to monitor the heating, i.e. the thermal function of the stream, separately, in accordance with the demands imposed on the treatment desired.

The particles can be activated, for example by radiation or as a result of collisions with a stream of charged particles, accelerated in an electromagnetic field. It is also possible to monitor the streams of activated and modifying particles by rapidly reducing or increasing the pressure of the gas which they form.

The range of the physical parameters of the stream acting on the treated surface can therefore be very substantially enlarged and enriched.

The density of the stream of particles falling on the treated surface must be reasonably great, without the activated sites being able to relax spontaneously, i.e. to revert to their original state before the modifying particles have fixed them. A high density of the flow can be achieved in two ways. The first consists of increasing the speed of the particles, and therefore their kinetic energy, in the direction perpendicular to the treated surface. This method is however limited to the formation of the radiative flaws in the structured treated.

The second method consists of increasing the density of the stream particles. An increase in density leads to the transition of the stream, which passes from the molecular state into a viscous stream. In this case, between the falling stream and the treated surface, a limit layer is formed, the thickness of which can be varied in order to vary the intensity of the treatment desired.

The limit layer plays a triple role in the present invention.
1) It plays the part of a barrier for the activated particles which, in order to reach the treated surface, must be diffused across the limit layer. The following condition is accordingly imposed on the thickness of the limit layer:

$$d < \sqrt{6 D\, t_{in}} \tag{2}$$

where D is the coefficient of diffusion and tin is the life time of the activated particles. The hydrodynamic qualities of the stream are accordingly chosen in such a way that the inequality (2) is satisfied. This latter inequality replaces the right-hand inequality in (1).

2) The limit layer is a useful barrier against the return and redepositing on the treated surface of the residual molecules resulting from the treatment of the surface (during pickling, for example).

3) The limit layer may play an active role, generating activated particles. In this case, the hydrodynamic parameters of the stream are selected in such a way as to satisfy the inequality:

$$d_1 < \sqrt{6 D\, t_{in}} \tag{2}$$

where $d_1$ is the distance of the treated surface from the generation area of the activated particles.

It is evident that $d_1 < d$, a case of which (1) does not take account.

The invention allows for the realisation, apart from known technologies which are implemented by the DPO method, of technologies which have not yet been implemented: the adhesive bonding or welding at the molecular level of pairs of uniform or heterogenous materials, which cannot be bond or welded to each other by the known methods, the treatment of non-regular, particularly natural, organic polycondensates, which are obtained by guiding the activating and modifying thermal functions of the stream and broadening the range of physical parameters of the stream used for the treatment.

The present invention can be used in particular for the disinfection and sterilisation of surfaces, for film deposition operations, for the pickling and cleaning of surface alloys in the semi-conductor industry, in order to create bactericidal surfaces, coatings for a variety of purposes, etc.

The originality of the process according to the invention rests in the performance of the following procedures:

1 creation of several streams of activated particles, 2 application of these streams on the surface to be treated in such a way that the activated particles of the streams acting on the surface create chemically active sites, and that the modifying particles occupy these sites, 3 this operation is made possible thanks to the provision for the activated particles of a greater energy than the energy at break of the inhibited bonds of the surface to be treated, and lower than the radiative flaw formation energy, and 4 the intensity on the treated surface of the stream of activated particles, as well as of the stream of modifying particles is larger than the quantity N/t, where N is the surface density of the inhibited bonds to be broken and t is the duration of presence of any point on the surface beneath the stream.

It will also be noted that the process according to the invention differs from the DPO method due to the fact that:

1 the active particle stream is formed of activated particles, creating chemically active sites on the surface, and the stream of modifying particles occupies these sites, 2 this is with an energy of the activated particles greater than energy at break of the inhibited bonds of the surface and lower than the radiative flaw formation energy, and 3 the intensity on the treated surface of the stream of activated particles, as well as of the modifying particles, is greater than the quantity N/t, where N is the surface density of the inhibited bonds at break and t is the duration of the presence of any point on the treated surface beneath the stream.

The process according to the invention and the device for its implementation may be put into effect on equipment of different types. Given that this process allows for highly diverse surface treatments to be carried out, only the essential elements will be cited which are necessary for any equipment for the realisation of the invention: A stream generator for the activated particles, a stream generator for modifying particles (the two generators, in certain specific cases, may be reduced to one single generator), devices for bringing about the contact between the particles streams and the treated surface, transport devices which ensure the relative movement of the treated surface and the activating and modifying flows, devices for the evacuation of the residual products of the process. The general layout of the process is shown in FIG. 1.

Figure 2:
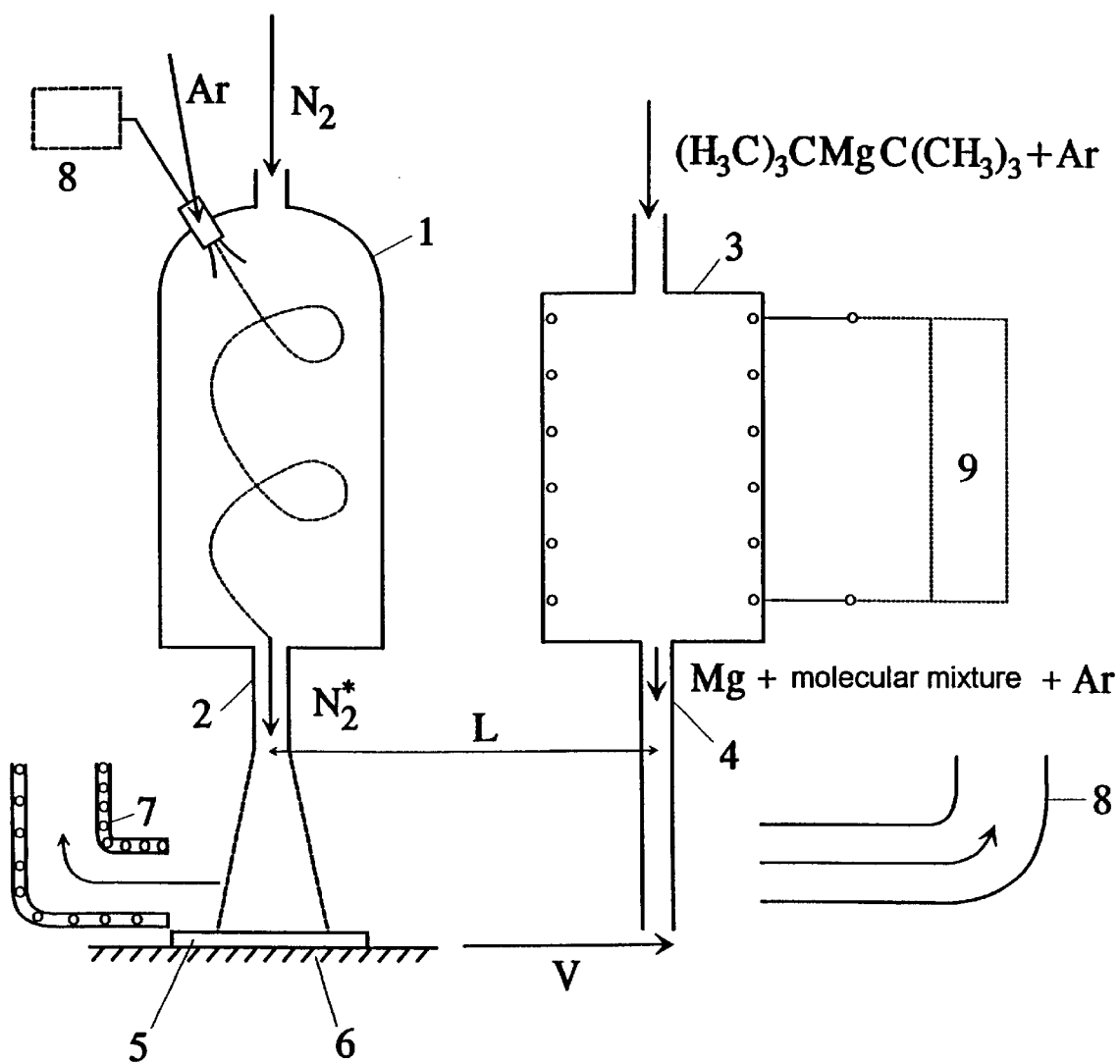
FIG. 2 is a first embodiment example of the device according to the invention; the reference figures relating to FIG. 2 are as follows:
1. Argon plasma reactor for the excitation of nitrogen molecules (P=1 atm)
2. Plasma pipe and jet containing excited nitrogen molecules (transport of activated particles)
3. Heaters for di-tertiary butyl ($H_3$ C)$_3$ C Mg C (CH$_3$)$_3$) vapour diluted in a stream of neutral gas (Ar). Heating temperature: 1000 K
4. Distribution pipe (transport of modifying particles Pg)
5. Polyethylene surface to be treated
6. Transport device providing for the relative movement of the surface to be treated in relation to the two reactors. V=5 m/s b=0.1 m Exposure time for activation 2·10−3 s
7. Evacuation device for the residual activation products
8. Modification ventilation system
9. Energy source.
Figure 3:
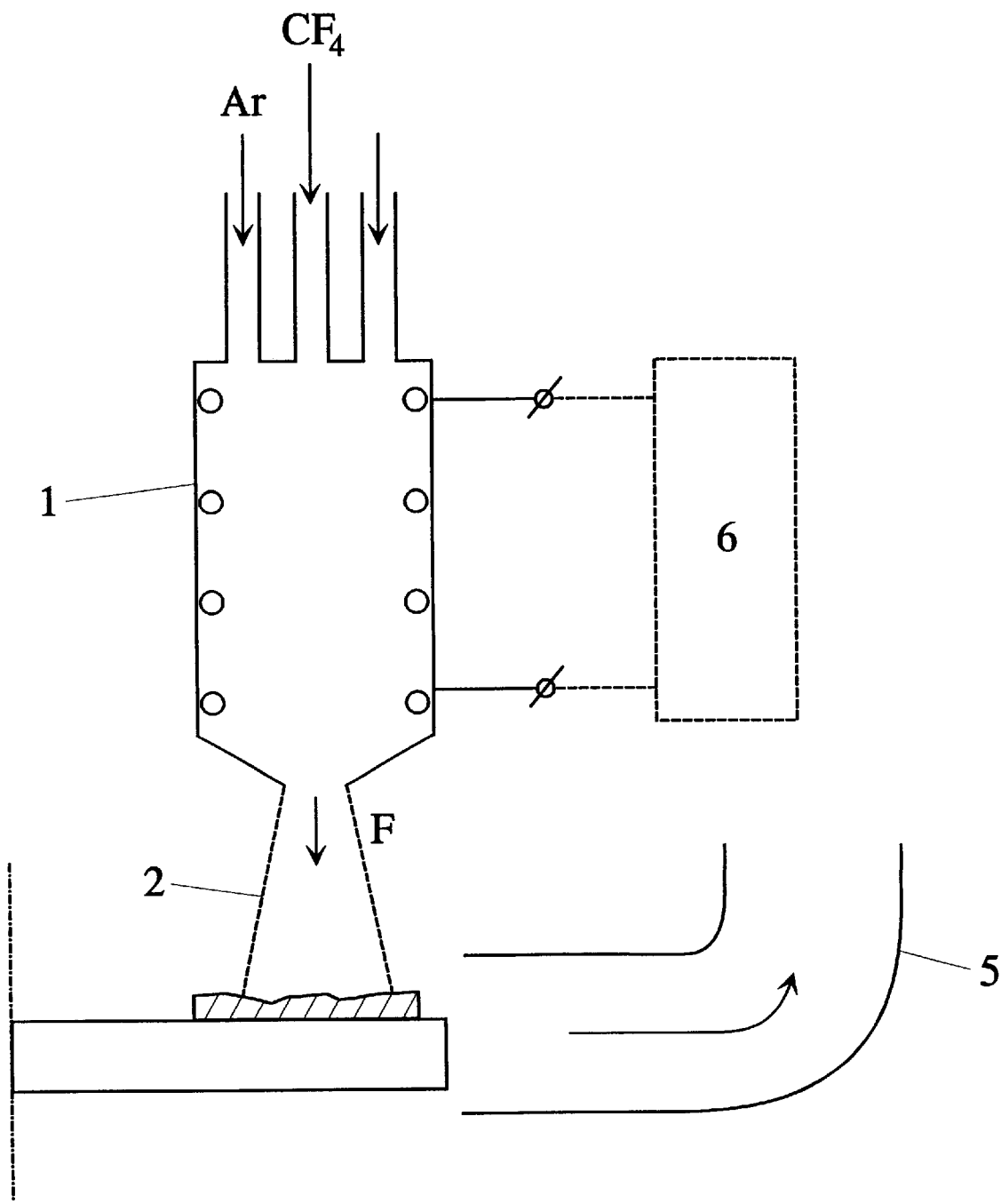
FIG. 3 is a second embodiment example of the device according to the invention; the reference figures relating to FIG. 3 are as follows:
1. Reactor for heating and decomposition of the carbon tetrafluoride (T>2000 K), with liberation of F atoms (activated and modifying particles coinciding)
2. Argon flow, transporting the F atoms towards the silicon surface
3. Silicon plate
4. Device for moving the silicon plates under the F jet
5. Ventilation (evacuation of residual particles)
6. Energy source
Figure 4:
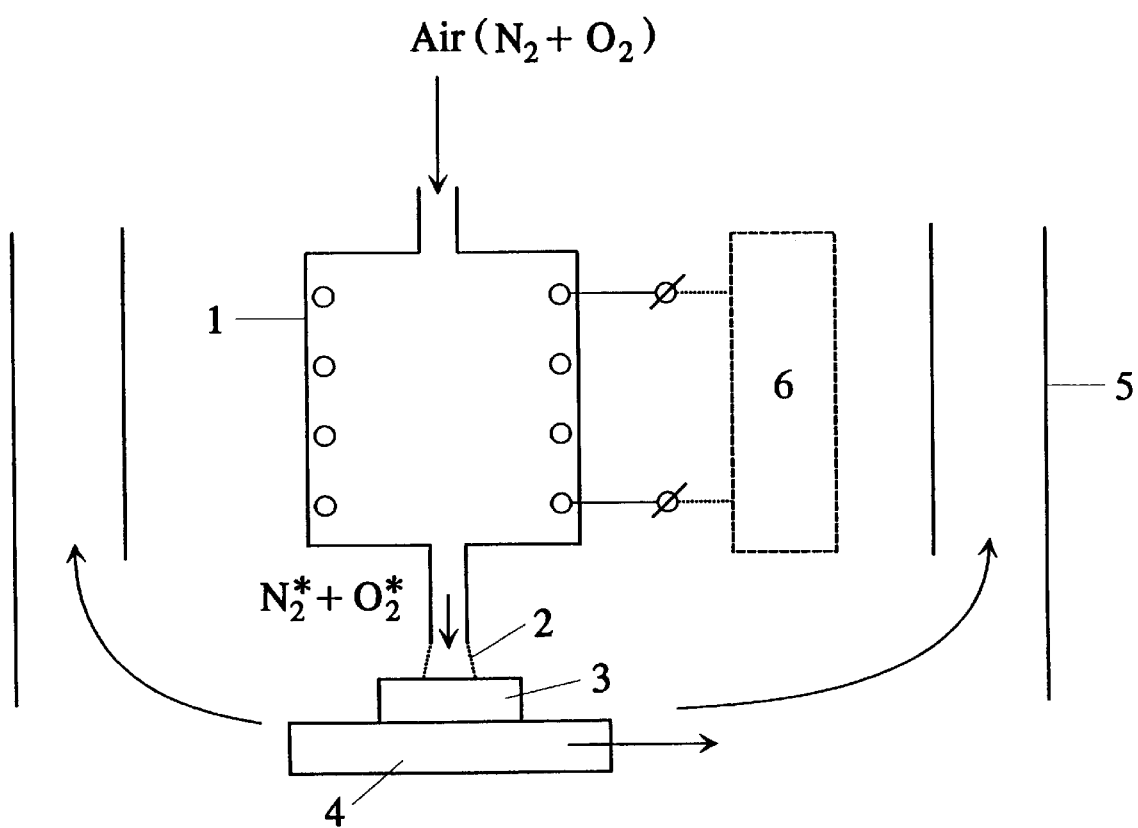
FIG. 4 is a third embodiment example of the device according to the invention; the reference numbers relating to FIG. 4 are as follows:
1. Reactor, for heating and activating the oxygen and nitrogen molecules in the air at T approx. 1000 K
2. Pipe forming the jet of excited air and directing it towards the iridium surface
3. Iridium object
4. Device for transporting the iridium object at V approx. 1 m/s
5. Ventilation (device for evacuating the residual products)
6. Energy source

Some embodiments of the devices for the implementation of the process are indicated below, in relation to FIGS. 2 to 4.

EXAMPLE 1

Deposition of Magnesium on Polyethylene

The energy of the inhibited bonds is equal to 4 eV, the surface density of these bonds is $10^{15}$ cm$^{-2}$, and the part of the surface bonds to be broken is 10%. In view of the thermal instability of polyethylene, the duration of treatment must not exceed $10^{-3}$ s. The density of the stream of activated particles must therefore not be less than $10^{17}$ cm$^{-2}$ s$^{-1}$. For the quality of activated particles, excited molecules of nitrogen $N_2$ are chosen ($B^3$ Pg, $A^3S+_a$, $aS-_u$, $a^1$Pg) with activation energy values within the limits from 6 to 9 eV. With regard to the quality of the modifying particles, magnesium atoms are chosen, obtained thanks to the thermal decomposition of di-tertiary butyl vapours (($H_3$ C)$_3$ C Mg C (CH$_3$)$_3$) diluted in a stream of neutral gas heated to 1000 K. The density of the stream of modifying particles (magnesium atoms) must be greater than $10^{17}$ cm$^{-2}$ s$^{-1}$.

The result is that the polyethylene is covered by a layer of magnesium with an adhesion energy of the order of. 4 eV and a partiality coefficient of 0.1. This device is illustrated in FIG. 2.

EXAMPLE 2

Cold Pickling on Silicon

The energy of the inhibited bonds of silicon is about 1 eV; the total surface density of these bonds is about $10^{15}$ cm$^{-2}$, and the proportion of the surface bonds at break is 100%. To obtain a pickling rate of 10 microns/s, the time t of presence beneath the stream for an atomic layer should be about $3 \cdot 10^{-3}$ s. Accordingly, the stream of activated particles must not be less than $3 \cdot 10^{18}$ cm$^{-2}$ s$^{-1}$. For the quality of the activated particles, fluorine atoms are chosen, thermically obtained thanks to the decomposition of the carbon tetrafluoride (CF$_4$) in the stream of gas heated to more than 2000 K. The activation energy in this case is the energy of the affinity of the electrons to the fluoride atoms, and is 3.4 eV. With regard to the modifying particles, fluoride atoms are likewise used; in this example, the activated and modifying particles coincide.

The result is that the pickling of silicon is effected at a speed of 10 microns/s with energy losses of an order of magnitude lower than that of the DPO method. The corresponding device is illustrated in FIG. 3.

EXAMPLE 3

Molecular Oxidation of Iridium

The energy of the inhibited bonds is equal to 0.1 eV, the total surface density of these bonds being $3 \cdot 10^{15}$ cm$^{-2}$, the proportion of the surface bonds at break being 100%. The time t is of the order of $10^{-2}$ s. The stream of activated particles must not be lower than $3 \cdot 10^{17}$ cm$^{-2}$ s$^{-1}$.

For the quality of the activated particles, molecules of oxygen and nitrogen from the heated air (about 1000 K) are chosen. The activation energy in this case is the thermal energy of the molecules. As modifying particles, oxygen molecules are used. The stream of modifying particles cannot be below $3 \cdot 10^{17}$ cm$^{-2}$ s$^{-1}$ In this example, the real stream of the activated particles, considering the use of air, far exceeds the limit demands of the method.

The result is that the surface of the iridium is covered with a mono-layer of oxygen molecules, easily decomposable. The energy expenditure values are two orders of magnitude lower than those of the DPO method.

In this way, the process according to the invention allows for the scope of utilisation of the DPO method to be broadened, and in particular allows for the creation of new methods of treatment, such as, for example, the formation of solidifying metallic layers on polymers, while still reducing energy expenditure values, thanks in particular to the reduction of the temperature of treatment. The corresponding device is illustrated in FIG. 4.

What is claimed is:

1. Surface treatment method, for condensed media, in the course of which at least one stream of active particles is created and directed at atmospheric pressure onto a surface which is to be treated, and caused to interact with said surface, wherein said active particles comprise activated particles, forming at first chemically active sites on said surface, and modifying particles subsequently occupying these sites, the energy of the activated particles being greater than the energy of break of inhibited surface bonds of said surface and lower than the energy of formation of radiative flaws on said surface, the density, at the level of the surface being treated, of the stream of activated particles and of the stream of modifying particles being greater than the quantity N/t, where N is the surface density of the inhibited bonds to be broken, and t is the presence time of any point of said surface beneath said at least one stream.

2. A surface treatment method as claimed in claim 1, wherein said condensed media is a hard body.

3. A surface treatment method as claimed in claim 1, wherein said active particles are selected from excited molecules and excited atoms.

4. A surface treatment method according to claim 1, wherein a support device for the surface to be treated is provided, a first generator creates a stream of said activated particles, said activated particles are transported towards the surface to be treated with a sufficient speed to allow the formation of chemically active sites on said surface, wherein a chemical precursor compound of said modifying particles is introduced into a second generator and said second generator creates a steam of modifying particles, said modifying particles are transported onto said surface comprising chemically active sites for occupying said sites.

5. A surface treatment method according to claim 4, wherein said support device for the surface to be treated is subjected to a relative displacement in relation to the streams of activated and modifying particles, ensuring that a same zone of the surface to be treated is at first under the stream of the activated particles and subsequently under the stream of the modifying particles, so that the time lapse between actions of activation and modification is lower than the life time of the chemically active sited created on the surface by the activated particles.

6. A surface treatment method according to claim 4, wherein a particles evacuation means ensuring the evacuation of the activated particles, when totally or partially deactivated after their interaction on the surface to be treated, is associated to the first generator, and in that a particles evacuation means ensuring the evacuation of the residual particles resulting from the interaction of the modifying particles with the surface comprising chemical active sited is associated to the second generator.

7. A surface treatment method according to claim 1, wherein only one generator is ensuring the simultaneous generation of a stream of activated particles and a stream of modifying particles.

8. A surface treatment method according to claim 7, wherein a single introduction device is ensuring the simultaneous introduction of the particles to be activated and the chemical compounds precursors of modifying particles and wherein the generator allows the creation of a single stream containing both activated particles and modifying particles.

9. A surface treatment method according to claim 1, wherein means for transporting the activated particles on the one part and the modifying particles on the other part, consist in gas streams and in that the speed of the said streams is such that the transport durations are respectively lower than the life times of said activated and modifying particles.

* * * * *

UNITED STATES PATENT AND TRADEMARK OFFICE
CERTIFICATE OF CORRECTION

PATENT NO.    : 6,365,235 B2
DATED         : April 2, 2002
INVENTOR(S)   : Pavel Koulik and Evgenia Zorina It is certified that error appears in the above-identified patent and that said Letters Patent is hereby corrected as shown below:

Column 1,
Line 8, please delete "It,likewise" and insert in lieu thereof -- It likewise --.

Column 6,
Line 38, please delete "tin" and insert in lieu thereof -- $t_{in}$ --.

Column 8,
Line 10, please delete "of the order of.4 eV" and insert in lieu thereof -- of the order of 4 eV --.

Signed and Sealed this

Twenty-ninth Day of October, 2002

Attest:

Attesting Officer

JAMES E. ROGAN
*Director of the United States Patent and Trademark Office*